(12) United States Patent
Iwamoto et al.

(10) Patent No.: US 6,923,882 B2
(45) Date of Patent: Aug. 2, 2005

(54) COMPLIANT PRE-FORM INTERCONNECT

(75) Inventors: Nancy E. Iwamoto, Ramona, CA (US); Jesse Pedigo, Chippewa Falls, WI (US); Stephen Tisdale, Endicott, NY (US)

(73) Assignee: Honeywell International Inc., Morristown, NJ (US)

( * ) Notice: Subject to any disclaimer, the term of this patent is extended or adjusted under 35 U.S.C. 154(b) by 39 days.

(21) Appl. No.: 09/818,324

(22) Filed: Mar. 26, 2001

(65) Prior Publication Data

US 2002/0136874 A1 Sep. 26, 2002

(51) Int. Cl.[7] .......................... B32B 31/06; B32B 31/12
(52) U.S. Cl. ...................... 156/252; 156/235; 156/289; 156/293; 156/306.9; 439/91
(58) Field of Search ................................ 156/230, 231, 156/235, 252, 293, 306.9, 289; 174/255; 257/700; 439/91

(56) References Cited

U.S. PATENT DOCUMENTS

| | | | |
|---|---|---|---|
| 3,703,603 A | * 11/1972 | Levesoue et al. | |
| 4,008,300 A | 2/1977 | Ponn | ......................... 264/104 |
| 4,209,481 A | * 6/1980 | Kashiro et al. | |
| 4,740,657 A | * 4/1988 | Tsukagoshi et al. | |
| 5,049,085 A | * 9/1991 | Reylek et al. | |
| 5,049,434 A | * 9/1991 | Walsulko | ................. 156/230 X |
| 5,123,986 A | * 6/1992 | Sugiyama et al. | ....... 156/235 X |
| 5,174,766 A | * 12/1992 | Yoshizawa et al. | |
| 5,216,807 A | * 6/1993 | Yoshizawa et al. | |
| 5,275,856 A | 1/1994 | Calhoun et al. | ............... 428/40 |
| 5,373,786 A | * 12/1994 | Umaba | |
| 5,445,308 A | * 8/1995 | Nelson et al. | |
| 5,522,962 A | * 6/1996 | Koskenmaki et al. | |
| 5,637,176 A | * 6/1997 | Gilleo et al. | |
| 5,667,884 A | * 9/1997 | Bolger | ........................ 428/323 |
| 5,685,939 A | 11/1997 | Wolk et al. | .................. 156/234 |
| 5,749,997 A | * 5/1998 | Tang et al. | |
| 5,891,366 A | 4/1999 | Gruenwald et al. | .......... 252/514 |
| 5,924,622 A | * 7/1999 | Davis et al. | ................ 228/56.3 |
| 5,965,064 A | * 10/1999 | Yamada et al. | |
| 6,174,175 B1 | * 1/2001 | Behfar et al. | |
| 6,270,363 B1 | * 8/2001 | Brofman et al. | |
| 6,336,990 B1 | * 1/2002 | Tanaka et al. | ............ 156/306.9 |
| 6,399,178 B1 | * 6/2002 | Chung | |
| 6,580,035 B1 | * 6/2003 | Chung | ......................... 174/255 |

OTHER PUBLICATIONS

Brian Bauer and Rick Lathrop, "An Introduction to Solder Materials," Technical Papers, Heraeus Incorporated, 1999.*

* cited by examiner

*Primary Examiner*—Melvin C. Mayes
(74) *Attorney, Agent, or Firm*—Sandra P. Thompson; Bingham McCutchen

(57) ABSTRACT

An assembly having a thermosetting layer pierced by a plurality of conductors is formed on a release sheet and subsequently sandwiched between an IC and a PWB or other supporting surface and subsequently cured. The release sheet is removed either before or during curing of the thermosetting material. Removal prior to curing may be accomplished via peeling. Removal during curing may be by destruction of the layer by the curing process.

10 Claims, 1 Drawing Sheet

COMPLIANT PRE-FORM INTERCONNECT

FIELD OF THE INVENTION

The field of the invention is integrated circuit packaging and mounting.

BACKGROUND OF THE INVENTION

The use of underfill compositions for mounting integrated circuit (IC) devices supporting surfaces such as printed wiring boards "PWBs" to obtain improved thermal and dimensional performance properties are known. An example of such can be found in U.S. Pat. No. 5,654,081, titled *Integrated Circuit Assembly with Polymeric Underfill Body*, which discusses the use of particular underfill compositions in mounting flip-chip IC devices to circuit boards.

Underfill compositions can be positioned between the IC and the surface (hereinafter PWB for simplicity) to which it is to be mounted either before or after electrical/metallurgical connections between the IC and PWB are made. If it is to be done after electrical connections are formed, an underfill material can be injected from the sides of gap between the IC and PWB, or through a hole in the PWB located beneath the IC. However, such injection methods tend to be problematic in regard to the time required to inject the underfill, and the difficulty in assuring a complete, uniform distribution of underfill material.

If it is to be accomplished prior to formation of the electrical connections, the underfill can either be "built-up" on (i.e. printed onto) either the IC or PWB, or provided as a pre-form which is sandwiched between the IC and PWB. Patents referencing the build up process include both U.S. Pat. No. 5,654,081 previously discussed and U.S. Pat. No. 5,936,847 titled *Low Profile Electronic Circuit Modules*. Printing material onto the IC or the PWB is not always desirable as it tends to overly complicate the handling process and cannot be done in parallel with formation of the ICs and PWBs.

A patent which utilizes a conductorless pre-form is U.S. Pat. No. 6,040,630 titled *Integrated Circuit Package for Flip Chip with Alignment Preform Feature and Method of Forming Same*. Unfortunately, conductorless preforms require the use of pads or other conductors on the IC and/or PWB which can extend through the preform.

A pre-from comprising a filled perforated dielectric structure wherein the dielectric comprises a coated polyimide film and the fill material comprises a transient liquid phase sintered material is utilized in U.S. Pat. No. 5,948,533 titled *Vertically Interconnected Electronic Assemblies and Compositions Useful Therefor*. However, the use of coated polyimide films is not desirable in all circumstances.

Thus, there is a need for improved methods and devices for underfilling an IC mounted to a supporting surface such as a PWB.

SUMMARY OF THE INVENTION

The present invention is directed to methods and apparatus in which an assembly comprising a thermosetting layer pierced by a plurality of conductors is formed on a release sheet and subsequently sandwiched between an IC and a PWB or other supporting surface and subsequently cured. The release sheet is removed either before or during curing of the thermosetting material. Removal prior to curing may be accomplished via peeling. Removal during curing may be by destruction of the layer by the curing process.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
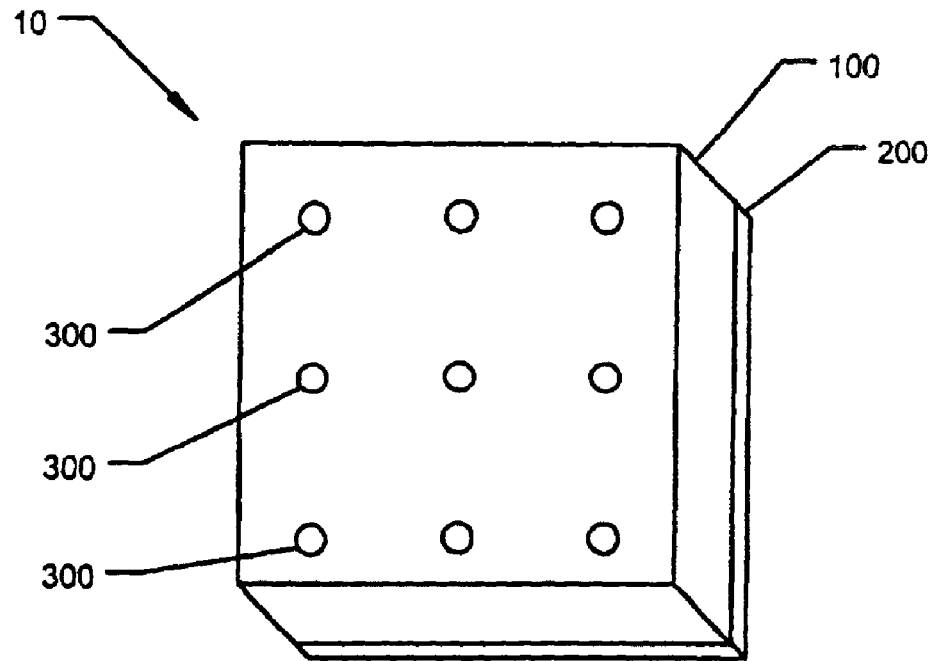
FIG. 1 is a perspective top view of a compliant pre-form interconnect embodying the invention.
Figure 2:
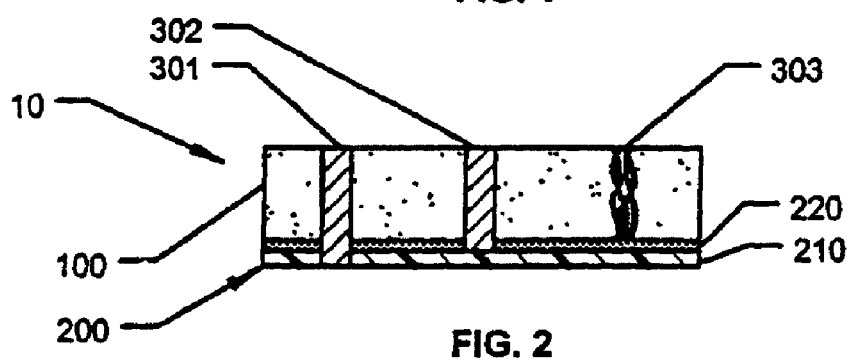
FIG. 2 is a cutaway view of a compliant pre-form interconnect embodying the invention.
Figure 3:
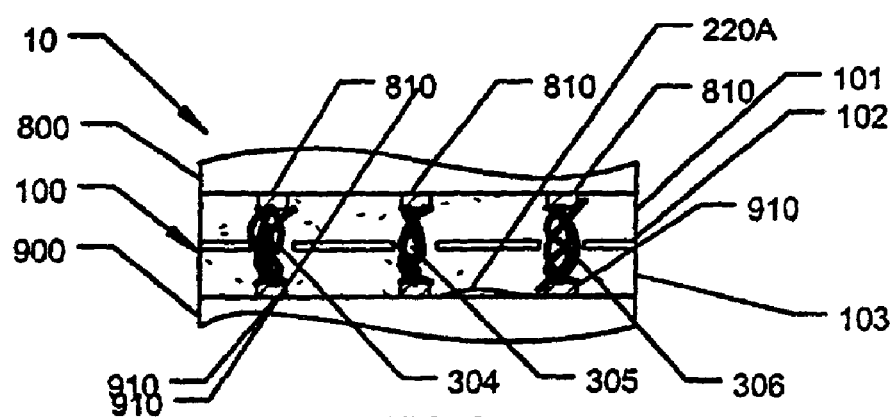
FIG. 3 is a cutaway view of the interconnect of a compliant pre-form interconnect embodying the invention coupling an integrated circuit to a printed wiring board.

In FIG. 1–3, a preferred pre-form assembly 10 comprises a base layer assembly 100, a sacrificial layer assembly 200, and through conductors 300.

Base layer assembly preferably 100 comprises a single B-staged thermosetting material. Although a thermoplastic material may be used, it is contemplated that a thermosetting material provides additional strength and stability. Preferred B-staged thermosetting materials include but are not necessarily limited to cyanate esters, cycloaliphatic epoxies, bismaleimides, cyanate ester/epoxy copolymers, cyanate ester/bismaleimide copolymers or blends and cycloaliphatic epoxy/bismaleimide copolymers or blends. Although preferably formed from a single layer, it is contemplated that base layer assembly 100 may be a multi-layer assembly.

Sacrificial assembly 200 comprises sacrificial layer 210 and release coating 220. Sacrificial layer 210 is preferably formed from a relatively cheap material such as a polyester or a celluloid film. Release coating 220 preferably is located between the sacrificial layer 210 and base layer assembly 100, and comprises standard silicon, Teflon® or graphite release agents such as commercially available materials which are available from Chemlease™ and Buehler™. An example of such a commercially available material is POLESE 233™. In other embodiments, the sacrificial layer assembly 200 may not include release coating 220, particularly if using materials with low natural surface energy and low adhesion to other materials, such as Teflon® and oriented polyimide. In a less-preferred embodiment, the sacrificial layer is not removed but becomes part of the final structure. It is contemplated that in many embodiments, traces of the release coating 220 will remain after removal of sacrificial layer 200.

The use of release coating 220 in conjunction with a cheap sacrificial layer 210 which comprises a polyester or celluloid film is anticipated to provide numerous advantages over any existing protective covering methods and devices such as lowering the cost of sacrificial assembly 200, making it easier to utilize assembly 10, and increasing the flexibility of assembly 10.

Through conductors 300 may be formed by, among other methods, stitching/piercing wire through base layer assembly 100 or forming conductive vias in base layer assembly 100. Through conductors 300 may or may not punch through the sacrificial layer assembly 200 with the choice of whether to have the conductors 300 punch through being at least partially dependent on the method of manufacturing used and the type of object (i.e. a pad, a solder ball, a stud, or some other type) the through connector will ultimately be electrically coupled to. Thus, wire piercing may be the choice for use to connect to a pad or via on a package or board, but a via may be a better choice if connecting to a stud or ball. It is preferred that the choice of type of through conductor and whether it penetrates the sacrificial layer assembly 200 be made so as to accommodate a variety of configurations and manufacturing methods. FIG. 2 provides examples of both vias (301 and 302) and wires (303) and examples of a through conductor piercing the entire interconnect (301), piercing the base layer assembly 100 and release coating 220 (302), and piercing only the base layer 100 (303).

If conductive vias are used, it is contemplated that such vias will comprise a solder paste rather than a transient liquid phase sintered material. Preferred solder pastes include, PnSn, PbSnAg, indium alloys, and gold eutectic/ alloys, if wire piercing/thermosonic ball formation is used.

It is contemplated that extending the through conductors 300 into the sacrificial layer assembly 200 may provide additional mechanical stability for a corresponding alignment stability.

A preferred method of forming pre-form assembly 10 comprises: providing sacrificial layer 210, coating sacrificial layer 210 with release coating 220, applying a thermosetting material 100 on top of release coating 220 ; curing the thermosetting material 100 to form a B-stage layer; inserting through conductors 300 into thermosetting material 100 . Insertion of through conductors 300 preferably comprises either piercing wires 300 into the thermosetting material, or lasing or drilling and subsequently filling holes in thermosetting material 100 . The lased vias may be processed by "off-set" lasing to provide a larger bottom diameter footprint, to lessen registration to contact point difficulty. A preferred method of using pre-form assembly 10 comprises: providing an IC; providing a supporting surface to which the IC is to be mechanically and electrically bonded; providing pre-form assembly 10 ; applying pre-form assembly 10 to either the IC or supporting surface; peeling away sacrificial layer 210 ; sandwiching pre-form assembly 10 between the IC and the supporting surface; and curing the base layer assembly of pre-form assembly 10.

A mechanical support structure may be included during the construction of the thermosetting layer 100. In one embodiment thermosetting layer 100 includes a fiber mesh material which consists of but is not limited to glass, graphite, KEVLAR®, TEFLON®, or polyester into which the thermoset of layer 100 is impregnated. For additional mechanical support the thermoset may also be formulated with particulate fillers. Such fillers include but are not limited to: alumina, silica, graphite fibers, graphite particles, silicon nitride, silicon carbide, aluminum nitride, diamond, berylium, and conductive polymer filler.

If a thermal enhancement is required, the preform may include construction using a thermally conductive material. The preferred embodiment would use a non-electrically conductive filler into the thermosetting material 100. Such fillers include but are not limited to silicon nitride, silicon carbide, aluminum nitride, boron nitride, diamond, conductive polymer filler, graphite and alumina. In another embodiment a thermally conductive mesh material may be used in conjunction with the construction of the thermoset layer 100. In this example, a thermally conductive graphite mesh would be impregnated with the thermoset material and become part of layer 100. The thermoset material may or may not include formulation with the conductive filler. In a less preferred embodiment a physical thermal layer 102 would be added to the construction of the preform. For example a copper plane or a phase change film 102 could be added as a center layer between thermoset layers 101 and 103. The thermoset material used may or may not include formulation with the conductive filler, dependent upon the thermal construction desired.

Thus, specific embodiments and applications of compliant preform interconnects have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method for coupling an IC to a supporting surface comprising:

providing an IC;

providing a supporting surface to which the IC is to be mechanically and electrically bonded;

providing a pre-form assembly comprising a base layer and a sacrificial assembly, the base layer comprising a thermosetting material and wire or solder paste through conductors and the sacrificial assembly comprising a sacrificial layer and a release coating, wherein the release coating is located between the sacrificial layer and the base layer;

applying the pre-form assembly to either the IC or supporting surface;

sandwiching the base layer between the IC and the supporting surface; and curing the base layer; removing at least part of the sacrificial assembly, wherein removal of at least part of the sacrificial assembly comprises destruction of the layer during the curing of the base layer.

2. The method of claim 1 wherein providing the preform assembly comprises:

providing a sacrificial layer;

coating the sacrificial layer with a release coating to form a sacrificial assembly;

applying a thermosetting material on top of the release coating;

curing the thermosetting material to form a B-stage layer; and inserting through conductors into the thermosetting material.

3. The method of claim 2 wherein the step of inserting through conductors into the thermosetting material comprises either piercing wires into the thermosetting material, or lasing or drilling and subsequently filling holes in the thermosetting material with a solder paste.

4. The method of claim 2 wherein the release coating at least partially comprises silicon, polytetrafluoroethylene, or graphite release agents.

5. The method of claim 1 wherein the base layer further comprises a fine mesh fiber material impregnated with the thermosetting material, and the fine mesh fiber is thermally conductive.

6. The method of claim 1 wherein the base layer further comprises a fine mesh fiber martial impregnated with the thermosetting material and the fine mesh fiber is electrically non-conductive.

7. The method of claim 1 wherein the base layer further comprises the thermosetting material intermixed with a particle filler.

8. The method of claim 7 wherein the particle filler is thermally conductive.

9. The method of claim 7 wherein the particle filler is electrically non-conductive.

10. The method of claim 1, wherein the sacrificial layer comprises polyester or a celluloid film.

* * * * *